US012701928B2

(12) United States Patent
Cheng et al.

(10) Patent No.: US 12,701,928 B2
(45) Date of Patent: Aug. 4, 2026

(54) RRAM STRUCTURE AND FABRICATING METHOD OF THE SAME

(71) Applicant: UNITED MICROELECTRONICS CORP., Hsin-Chu City (TW)

(72) Inventors: Wei Cheng, Singapore (SG); Zhen Chen, Singapore (SG); Shen-De Wang, Hsinchu County (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 750 days.

(21) Appl. No.: 17/950,049

(22) Filed: Sep. 21, 2022

(65) Prior Publication Data

US 2024/0081158 A1     Mar. 7, 2024

(30) Foreign Application Priority Data

Sep. 1, 2022    (CN) .......................... 202211061192.8

(51) Int. Cl.
*H10N 70/00*        (2023.01)
*H10B 63/00*        (2023.01)

(52) U.S. Cl.
CPC ........... *H10N 70/063* (2023.02); *H10B 63/80* (2023.02); *H10N 70/826* (2023.02)

(58) Field of Classification Search
CPC .......................... H10N 70/063; H10N 70/8833
See application file for complete search history.

(56) References Cited

U.S. PATENT DOCUMENTS

| | | | | |
|---|---|---|---|---|
| 9,450,021 | B1 * | 9/2016 | Lee | H10N 70/24 |
| 9,806,255 | B1 | 10/2017 | Hsu | |
| 12,120,963 | B2 * | 10/2024 | Cheng | H10N 50/80 |
| 2014/0210103 | A1 * | 7/2014 | Satoh | H10N 50/01 |
| | | | | 257/774 |
| 2016/0218283 | A1 * | 7/2016 | Trinh | H10N 70/8833 |
| 2017/0222128 | A1 * | 8/2017 | Sung | H10D 64/00 |
| 2022/0359814 | A1 * | 11/2022 | Standaert | H10N 50/10 |
| 2023/0098122 | A1 * | 3/2023 | Dutta | H10N 50/80 |
| | | | | 257/427 |

* cited by examiner

*Primary Examiner* — Mounir S Amer
(74) *Attorney, Agent, or Firm* — Winston Hsu

(57) ABSTRACT

An RRAM structure includes a dielectric layer. A bottom electrode, a resistive switching layer and a top electrode are disposed from bottom to top on the dielectric layer. A spacer is disposed at sidewalls of the bottom electrode, the resistive switching layer and the top electrode. The spacer includes an L-shaped spacer and a sail-shaped spacer. The L-shaped spacer contacts the sidewall of the bottom electrode, the sidewall of the resistive switching layer and the sidewall of the top electrode. The sail-shaped spacer is disposed on the L-shaped spacer. A metal line is disposed on the top electrode and contacts the top electrode and the spacer.

20 Claims, 5 Drawing Sheets

RRAM STRUCTURE AND FABRICATING METHOD OF THE SAME

BACKGROUND OF THE INVENTION

1. Field of the Invention

The present invention relates to a resistive random access memory (RRAM) structure, and a fabricating method of the same, and more particularly to an RRAM structure with an L-shaped spacer and a fabricating method of the same.

2. Description of the Prior Art

Nonvolatile memory is capable of retaining the stored information even when unpowered. Non-volatile memory may be used for secondary storage or long-term persistent storage. RRAM technology has been gradually recognized as having exhibited those semiconductor memory advantages.

RRAM cells are non-volatile memory cells that store information by changes in electric resistance, not by changes in charge capacity. In general, the resistance of the resistive layer varies according to an applied voltage. An RRAM cell can be in a plurality of states in which the electric resistances are different. Each different state may represent a digital information. The state can be changed by applying a predetermined voltage or current between the electrodes. A state is maintained as long as a predetermined operation is not performed.

However, when forming devices used to applying bias to the RRAM, overetching or deficient etching often happens, and the switching speed between the high resistance state and the low resistance state of the RRAM becomes hard to control.

SUMMARY OF THE INVENTION

In view of this, the present invention provides an L-shaped spacer to control the etching depth.

According to a preferred embodiment of the present invention, an RRAM structure includes a dielectric layer. A bottom electrode, a resistive switching layer and a top electrode are disposed from bottom to top on the dielectric layer. A spacer is disposed at a sidewall of the bottom electrode, a sidewall of the resistive switching layer and a sidewall of the top electrode, wherein the spacer includes an L-shaped spacer and a sail-shaped spacer, the L-shaped spacer contacts the sidewall of the bottom electrode, the sidewall of the resistive switching layer and the sidewall of the top electrode and the sail-shaped spacer is disposed on the L-shaped spacer. A metal line is disposed on the top electrode and contacts the top electrode and the spacer.

A fabricating method of an RRAM structure includes providing a dielectric layer. Next, a bottom electrode, a resistive switching layer and a top electrode are formed to be disposed from bottom to top on the dielectric layer. Thereafter, a spacer are formed to be disposed at a sidewall of the bottom electrode, a sidewall of the resistive switching layer and a sidewall of the top electrode, wherein the spacer includes an L-shaped spacer and a sail-shaped spacer, the L-shaped spacer contacts the sidewall of the bottom electrode, the sidewall of the resistive switching layer and the sidewall of the top electrode and the sail-shaped spacer is disposed on the L-shaped spacer. Finally, a metal line is formed to be disposed on the top electrode and contacts the top electrode and the spacer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 5 depict a fabricating method of an RRAM structure according to a preferred embodiment of the present invention, wherein:

FIG. 1 depicts a dielectric layer with a metal line therein;

FIG. 2 is a fabricating stage in continuous of FIG. 1;

FIG. 3 is a fabricating stage in continuous of FIG. 2;

FIG. 4 is a fabricating stage in continuous of FIG. 3; and

FIG. 5 is a fabricating stage in continuous of FIG. 4.

DETAILED DESCRIPTION

FIG. 1 to FIG. 5 depict a fabricating method of a resistive random access memory (RRAM) structure according to a preferred embodiment of the present invention.

Figure 1:
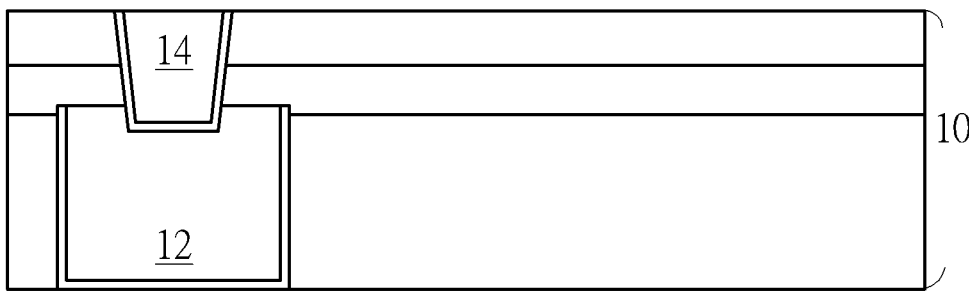

As shown in FIG. 1, a dielectric layer 10 is provided. A metal line 12 and a conductive plug 14 are disposed within the dielectric layer 10. The conductive plug 14 is disposed on the metal line 12 and contacts the metal line 12. The top surface of the conductive plug 14 is aligned with the top surface of the conductive layer 10. The dielectric layer 10 includes one or multiple insulating layers such as silicon oxide, silicon nitride, silicon carbon nitride, silicon oxynitride or silicon carbon oxynitride. The metal line 12 and the conductive plug 14 may independently include copper, aluminum, tungsten or other conductive materials.

Figure 2:
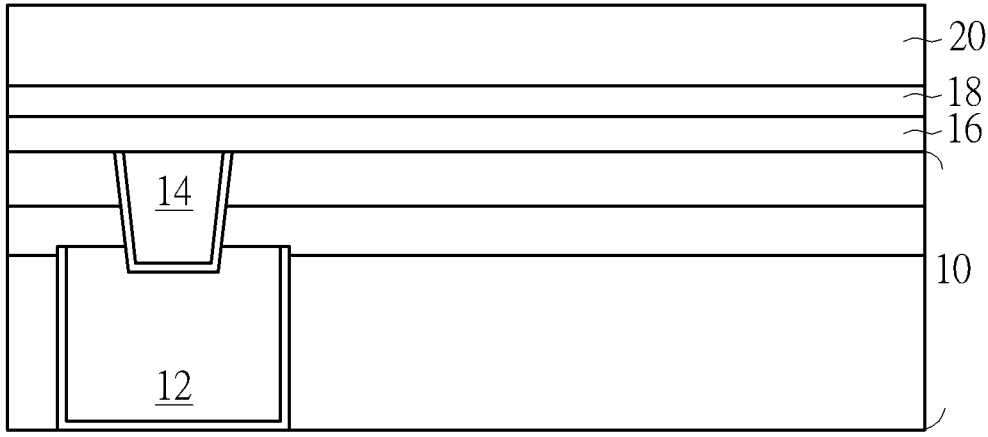

As shown in FIG. 2, a bottom electrode material layer 16, a resistive switching material layer 18 and a top electrode material layer 20 are formed in sequence to cover the dielectric layer 10. The bottom electrode material layer 16 and the top electrode material layer 20 may independently include tantalum, titanium, iridium, titanium nitride, tantalum nitride or other metals. The resistive switching material layer 18 includes tantalum oxide, nickel oxide, hafnium oxide or other transition metal oxides.

Figure 3:
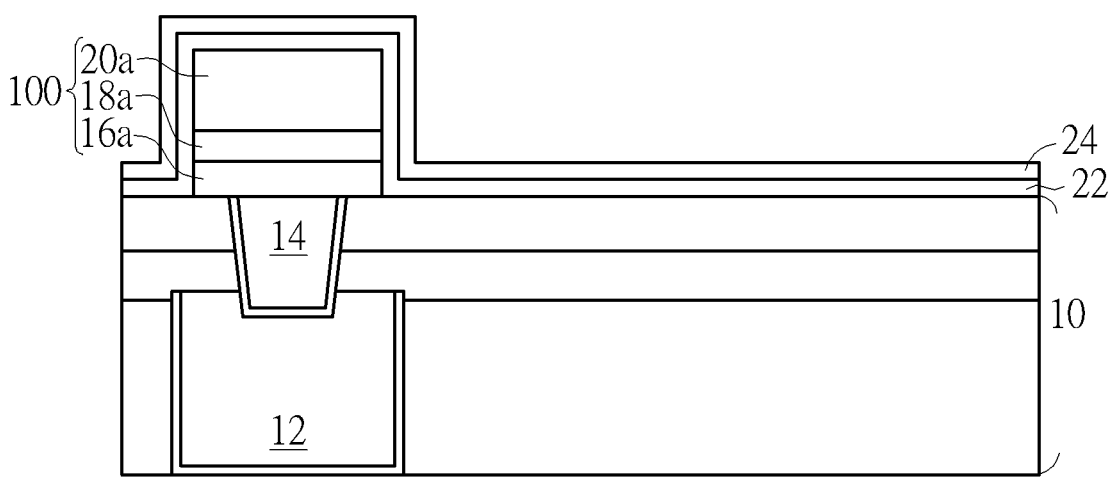

As shown in FIG. 3, the bottom electrode material layer 16, the resistive switching material layer 18 and the top electrode material layer 20 are patterned simultaneously to form the bottom electrode 16a, the resistive switching material layer 18a and the top electrode 20a. The bottom electrode 16a is on the conductive plug 14 and contacts the conductive plug 14. Now, the bottom electrode 16a, the resistive switching material layer 18a and the top electrode 20a constitute an RRAM 100. Then, a first material layer 22 is formed to conformally cover the dielectric layer 10, the bottom electrode 16a, the resistive switching material layer 18a and the top electrode 20a. Later, a second material layer 24 is formed to conformally cover the first material layer 22. The first material layer 22 is different from the second material layer 24. The first material layer 22 preferably includes silicon nitride. The second material layer 24 preferably includes silicon oxide.

Figure 4:
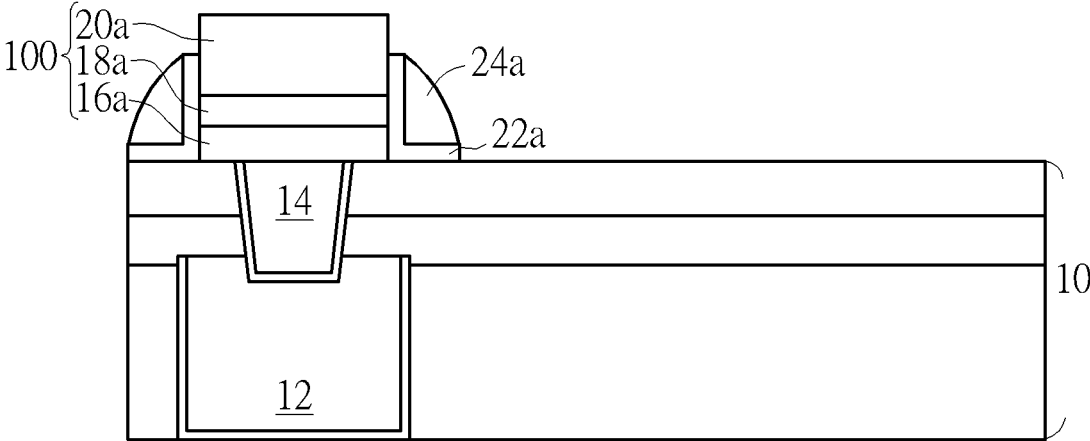

As shown in FIG. 4, the second material layer 24 and the first material layer 22 are patterned. The second material layer 24 and the first material layer 22 can be patterned by a dry etching. The second material layer 24 which is patterned becomes a sail-shaped spacer 24a. The first material layer 22 which is patterned becomes an L-shaped spacer 22a. Both of the topmost surface of the sail-shaped spacer 24a and the topmost surface of the L-shaped spacer 22a are lower than the topmost surface of the top electrode 20a.

Figure 5:
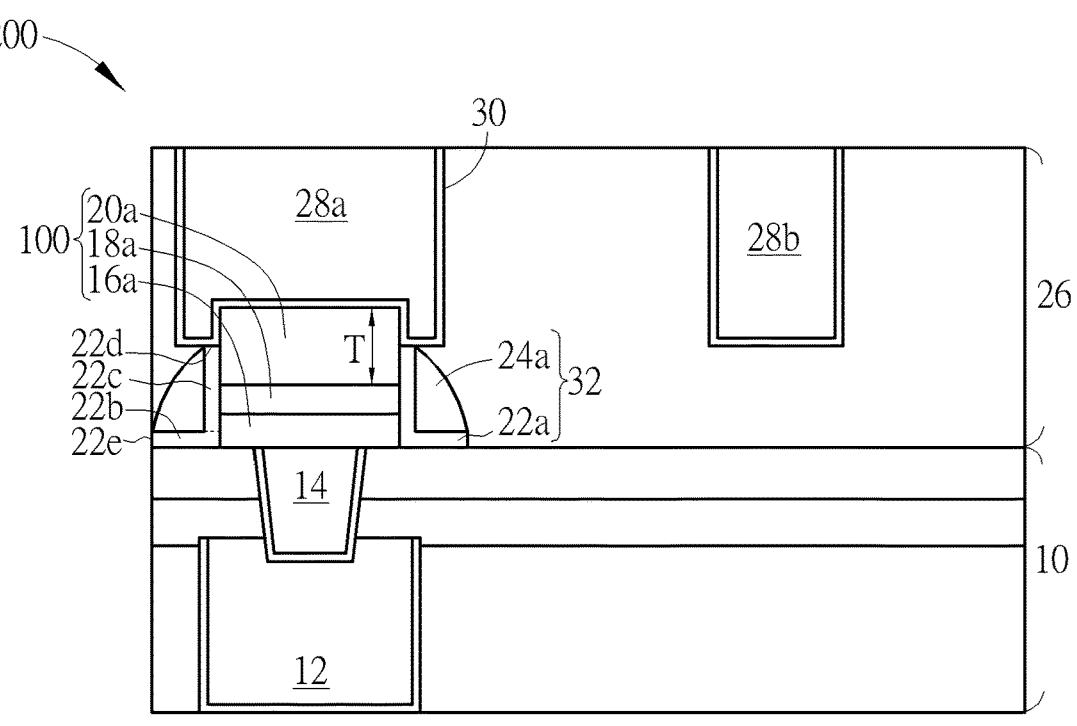

As shown in FIG. 5, a dielectric layer 26 is formed to cover the dielectric layer 10. After that, a metal line 28a and a metal line 28b are formed within the dielectric layer 26. The metal line 28a is disposed on the top electrode 20a and contacts the top electrode 20a, the L-shaped spacer 22a and the sail-shaped spacer 24a. The metal line 28b is disposed at one side of the metal line 28a. The metal line 28a and the metal line 28b are formed by the same fabricating step. The depth of the metal line 28a and the depth of the metal line 28b are the same. The steps of forming the metal line 28a include etching the dielectric layer 26 to form a recess 30 within the dielectric layer 26. After that, a metal layer fills in the recess 30 to form the metal line 28a. When etching the dielectric layer 26, the L-shaped spacer 22a and the sail-shaped spacer 24a together serve as an etching stop layer. At this point, an RRAM structure 200 of the present invention is completed.

As shown in FIG. 5, an RRAM structure 200 includes a dielectric layer 10. A bottom electrode 16a, a resistive switching layer 18a and a top electrode 20a are disposed from bottom to top on the dielectric layer 10. A spacer 32 is disposed at a sidewall of the bottom electrode 16a, a sidewall of the resistive switching layer 18a and a sidewall of the top electrode 20a. The spacer 32 includes an L-shaped spacer 22a and a sail-shaped spacer 24a. The L-shaped spacer 22a contacts the sidewall of the bottom electrode 16a, the sidewall of the resistive switching layer 18a and the sidewall of the top electrode 20a. The sail-shaped spacer 24a is disposed on the L-shaped spacer 22a. A metal line 28a is disposed on the top electrode 20a and contacts the top electrode 20a and the spacer 32.

In details, the L-shaped spacer 22a includes a vertical element 22c and a lateral element 22b. In FIG. 5, the vertical element 22c and the lateral element 22b are separated by dotted lines. The vertical element 22c is perpendicular to a top surface of the dielectric layer 10, and the lateral element 22b is parallel to the top surface of the dielectric layer 10. Both of the vertical element 22c and the lateral element 22b contact the RRAM 100. The vertical element 22c has a first end 22d, the first end 22d contacts the metal line 28a, and the first end 22d is lower than a topmost surface of the top electrode 20a. The topmost surface of the sail-shaped spacer 24a is also lower than the topmost surface of the top electrode 20a.

Figure 6:
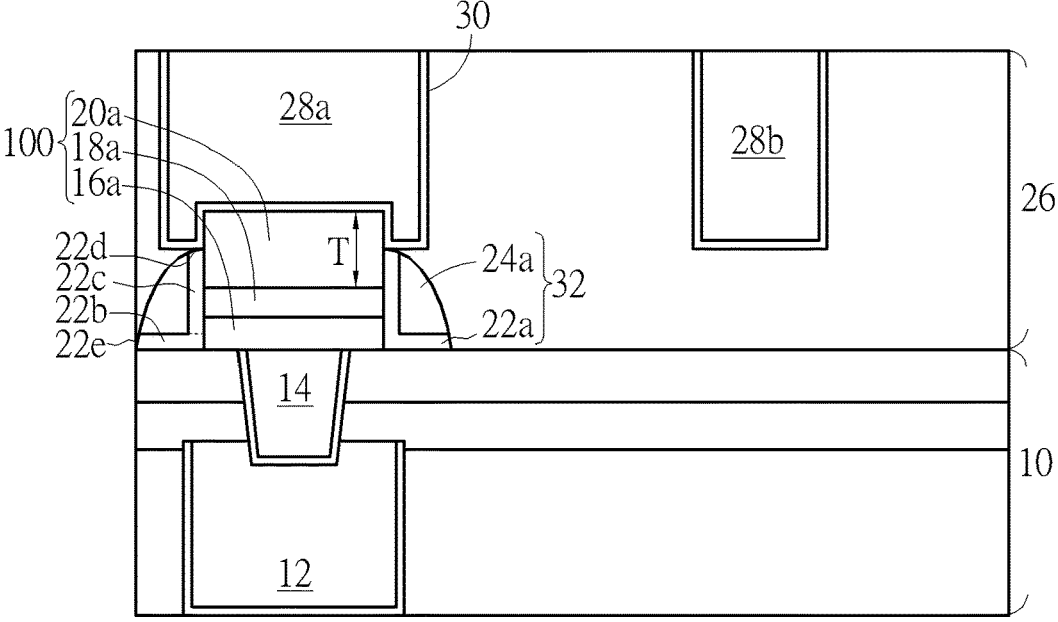
FIG. 6 depicts a preferred embodiment of an RRAM structure according to a preferred embodiment of the present invention.
Figure 7:
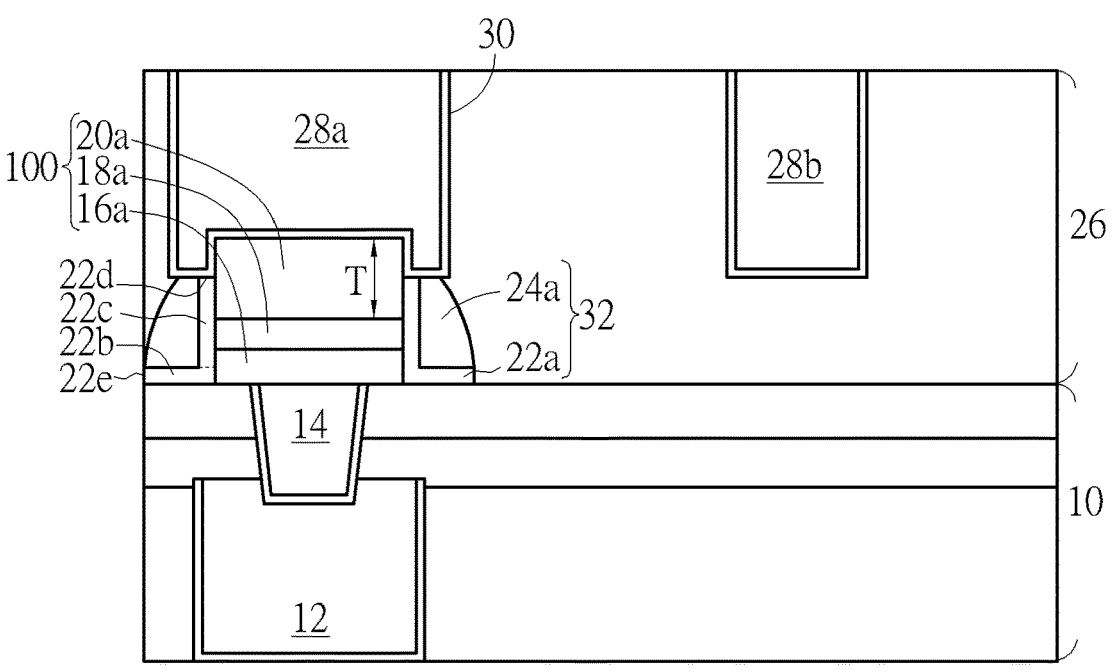
FIG. 7 depicts a preferred embodiment of an RRAM structure according to another preferred embodiment of the present invention.

Moreover, the surface of the first end 22d is parallel to the top surface of the dielectric layer 10. In other words, the surface of the first end 22d is horizontal. The lateral element 22b has a second end 22e away from the bottom electrode 16a. The second end 22e does not contact the bottom electrode 16a. The surface of the sail-shaped spacer 24a and the surface of the second end 22e together constitute an arc. According to another preferred embodiment of the present invention, as shown in FIG. 6, the surface of the first end 22d can be curved. Now, the surface of the first end 22d, the sail-shaped spacer 24a and the surface of the second end 22e together constitute another continuous arc. According to yet another preferred embodiment of the present invention, as shown in FIG. 7, the surface of the first end 22d is horizontal. The surface of the first end 22d contacts the metal line 28a. The contacting surface between sail-shaped spacer 24a and the metal layer 28a is also horizontal.

Please refer to FIG. 5. The top electrode 20a includes a thickness T, the thickness T is perpendicular to the top surface of the dielectric layer 10, and the first end 22d is aligned with half of the thickness T. However, as long as the first end 22d is lower than the topmost electrode 20a is in the scope of the present invention. Additionally, the surface of the sail-shaped spacer 24a should also be lower than the topmost surface of the top electrode 20a. Because the surface of the first end 22d and the surface of the sail-shaped spacer 24a are both lower than the topmost surface of the top electrode 20a, the metal line 28a is formed by taking the sail-shaped spacer 24a and the L-shaped spacer 22a as an etching stop layer, and the width of the metal line 28a is greater than the width of the top electrode 20a, thus the metal line 28a contacts the top surface of the top electrode 20a and two sidewalls of the top electrode 20a.

Furthermore, the material of the L-shaped spacer 22a is different from the material of the sail-shaped spacer 24a. According to a preferred embodiment of the present invention, the material of the L-shaped spacer 22a includes silicon nitride. The material of the sail-shaped spacer 24a includes silicon oxide.

After applying bias to the top electrode 20a and the bottom electrode 16a, current is generated to make conductive filaments formed within the resistive switching layer 18a, and the RRAM 100 is transformed into a low resistance state. In this way, the RRAM 100 can store data. If current is increased, the formation time of the conductive filaments becomes shorter. Therefore, higher current makes RRAM 100 transformed from a high resistance state into a low resistance state faster. When the contact area between the metal line 28a and the top electrode 20a is larger, current becomes higher. On the contrary, when the contact area between the metal line 28a and the top electrode 20a is smaller, current becomes lower. Traditionally, the dielectric layer 26 is etched to form the recess 30 by taking a conventional spacer which is around the RRAM 100 as an etching stop layer, if the etching stop layer does not stop the etching effectively, the recess 30 won't be at a suitable depth, which means that the recess 30 goes deeper than expected, and the contact area between the metal line 28a and the top electrode 20a will become too large. On the other hand, if the depth of the recess 30 is too shallow, the contact area between the metal line 28a and the top electrode 20a will become too small. When the contact area is too large, high current will form and formation time of the conductive filaments will become too short. When the contact area is too small, low current will form and formation time of the conductive filaments will become too long.

Therefore, as mentioned in the fabricating steps in FIG. 5, the dielectric layer 26 is etched to form the recess 30 by taking the sail-shaped spacer 24a and the L-shaped spacer 22a as an etching stop layer to assure the etching process can be stopped at a precise position. In the present invention, the first end 22d of the L-shaped spacer 22a makes the etching stop layer has a greater surface and the depth of the recess 30 can be controlled more precisely.

Figure 8:
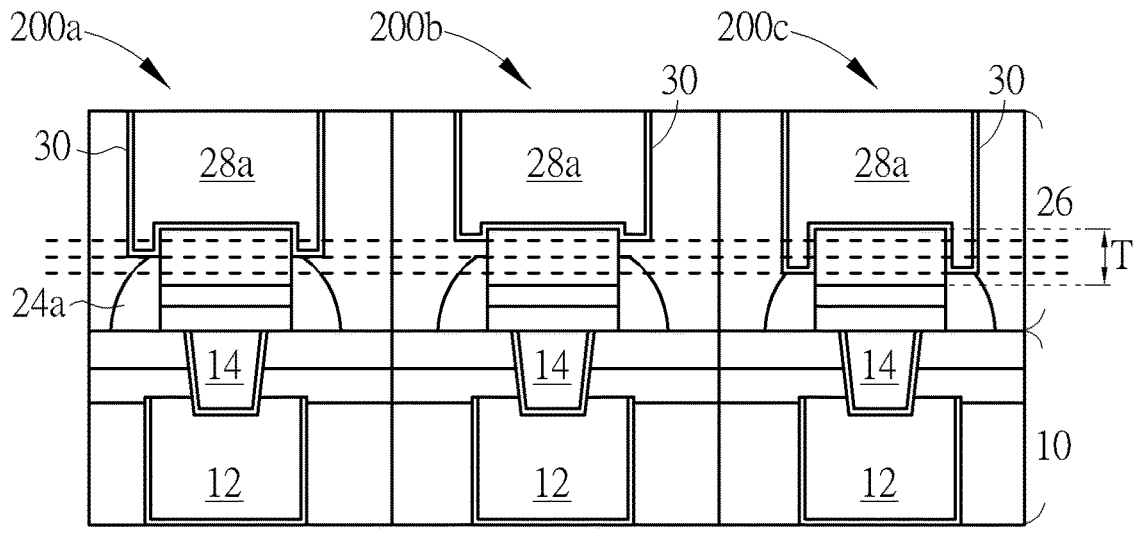
FIG. 8 depicts RRAM structures according to an example of the present invention.

FIG. 8 depicts RRAM structures according to an example of the present invention, wherein elements which are substantially the same as those in the embodiment of FIG. 5 are denoted by the same reference numerals; an accompanying explanation is therefore omitted. As shown in FIG. 8, there are three RRAM structures 200a/200b/200c disposed from left to right. The difference between the RRAM structure 200 and the RRAM structures 200a/200b/200c is that in the RRAM structures 200a/200b/200c, only the sail-shaped spacer 24a serves as an etching stop layer. Generally speaking, as shown in the RRAM structure 200a, the depth of the recess 30 is expected to be at half of the thickness T of the top electrode 20a. However, as shown in the RRAM structure 200c, because the topmost surface of the sail-shaped spacer 24a is pointed, which is too small to provide enough surface to stop the etching. Therefore, the dielectric layer 26 is overetched, and the depth of the recess 30 is lower than half of the thickness T of the top electrode 22a. In this circumstance, the contact area between the metal line 28a and the top electrode 22a becomes too large. On the other hand, as shown in the RRAM structure 200b, the depth of the recess 30 is smaller than half of the thickness T of the top electrode 22a in order to avoid overetching. This makes the contact area between the metal line 28a and the top electrode 22a becomes too small.

Then again, as shown in FIG. 5, the RRAM structure 200 has the L-shaped spacer 22a. The first end 22d of the L-shaped spacer 22a and the sail-shaped spacer 24a can provide enough surface as an etching stop layer while etching the dielectric layer 26. Therefore, the etching can be stopped at a predetermined position, i.e. the surface of the first end 22d, and the depth of the recess 30 can be controlled.

Figure 9:
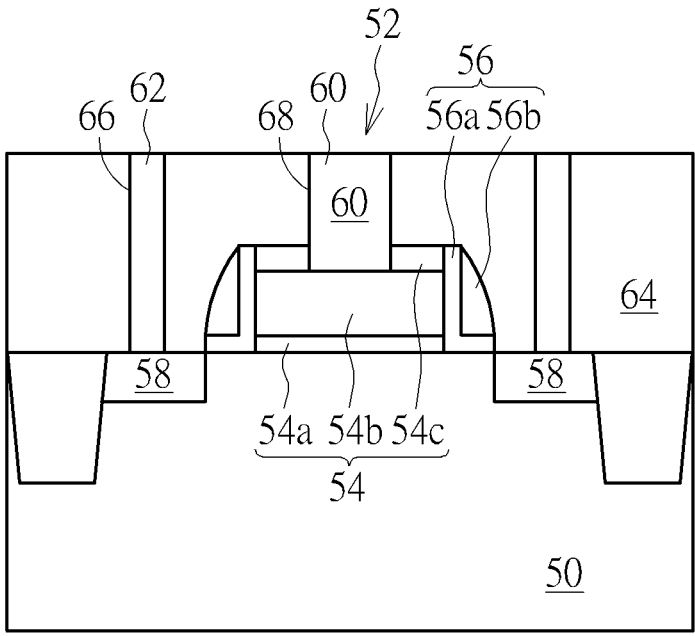
FIG. 9 depicts a transistor structure according to another example of the present invention.

FIG. 9 depicts a transistor structure according to another example of the present invention. As shown in FIG. 9, a substrate 50 is provided. A transistor 52 including a gate structure 54 is disposed on the substrate 50. The substrate 50 includes a bulk silicon substrate, a germanium substrate, a gallium arsenide substrate, a silicon germanium substrate, an indium phosphide substrate, a gallium nitride substrate, a silicon carbide substrate, or a silicon on insulator (SOI). The gate structure 54 includes a gate dielectric layer 54a, a gate electrode 54b and a cap layer 54c from bottom to top. The gate structure 54 contacts the substrate 50. A spacer 56 is disposed at one side of the gate structure 54. The spacer 56 includes an L-shaped spacer 56a and a sail-shaped spacer 56b. A source/drain doping region 58 is embedded within the substrate 50 which is aside of the spacer 56. A conductive plug 60 is disposed on and contacts the gate electrode 54b. The spacer 56 serves as a mask for implanting dopants to form the source/drain doping region 58. Moreover, when forming the conductive plug 62 on the source/drain doping region 58, a contact hole 66 needs to be formed in the dielectric layer 64 first. The spacer 56 serves as a protective layer for the gate structure 56 when forming the contact hole 66 to prevent the gate structure 54b from been etching. The spacer 56 of the transistor 52 does not serve as an etching stop layer for forming the contact plug 60. Because the width of the conductive plug 60 is smaller than the width of the gate structure 54, and the conductive plug 60 does not contact the sidewall of the gate structure 54, the spacer 56 is not used as an etching stop layer during the formation of the recess 68.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A resistive random access memory (RRAM) structure, comprising:
   a first dielectric layer;
   a bottom electrode, a resistive switching layer and a top electrode disposed from bottom to top on the first dielectric layer, wherein a conductive filament can be formed within the resistive switching layer when applying bias to the top electrode and the bottom electrode;
   a spacer disposed at a sidewall of the bottom electrode, a sidewall of the resistive switching layer and a sidewall of the top electrode, wherein the spacer comprises an L-shaped spacer and a sail-shaped spacer, the L-shaped spacer contacts the sidewall of the bottom electrode, the sidewall of the resistive switching layer and the sidewall of the top electrode and the sail-shaped spacer is disposed on the L-shaped spacer, the L-shaped spacer comprises a vertical element having a first end, the vertical element is perpendicular to a top surface of the first dielectric layer and a surface of the first end is horizontal; and
   a first metal line disposed on the top electrode and contacting the top electrode and the spacer, wherein the first metal line overlaps the sail-shaped spacer.

2. The RRAM structure of claim 1, wherein the L-shaped spacer further comprises a lateral element, the lateral element is parallel to the top surface of the first dielectric layer, the first end contacts the first metal line, and the first end is lower than a topmost surface of the top electrode.

3. The RRAM structure of claim 2, wherein the top electrode comprises a thickness, the thickness is perpendicular to the top surface of the first dielectric layer, and the first end is aligned with half of the thickness.

4. The RRAM structure of claim 2, wherein the lateral element comprises a second end which is away from the bottom electrode, and a surface of the sail-shaped spacer and a surface of the second end form an arc.

5. The RRAM structure of claim 4, wherein a distance between the arc and the sidewall of the resistive switching layer is smaller than a width of the resistive switching layer.

6. The RRAM structure of claim 2, wherein the surface of the first end is parallel to the top surface of the first dielectric layer.

7. The RRAM structure of claim 1, wherein the first metal line contacts a top surface of the top electrode and two sidewalls of the top electrode.

8. The RRAM structure of claim 1, wherein a width of the first metal line is greater than a width of the top electrode.

9. The RRAM structure of claim 1, wherein material of the L-shaped spacer is different from material of the sail-shaped spacer.

10. The RRAM structure of claim 1, wherein material of the L-shaped spacer comprises silicon nitride.

11. The RRAM structure of claim 1, wherein the first metal line contacts the sail-shaped spacer.

12. The RRAM structure of claim 1, wherein the first dielectric layer comprises one or multiple insulating layers comprising silicon oxide, silicon nitride, silicon carbon nitride, silicon oxynitride or silicon carbon oxynitride.

13. The RRAM structure of claim 1, wherein the first metal line comprises copper, aluminum or tungsten.

14. The RRAM structure of claim 1, further comprising a second dielectric layer covering the first dielectric layer, and the second dielectric layer comprises a recess.

15. The RRAM structure of claim 14, wherein the first metal line is disposed in the recess.

16. The RRAM structure of claim 14, wherein the L-shaped spacer and the sail-shaped spacer together serve as an etching stop layer when forming the recess.

17. The RRAM structure of claim 1, wherein the resistive switching material layer comprises tantalum oxide, nickel oxide, or hafnium oxide.

18. The RRAM structure of claim 1, further comprising a conductive plug in the first dielectric layer and under the bottom electrode, and a width of the conductive plug is smaller than a width of the resistive switching layer.

19. The RRAM structure of claim 1, further comprising a second metal line disposed at one side of the first metal line, and a depth of the second metal line and a depth of the first metal line are the same.

20. The RRAM structure of claim 1, wherein the first dielectric layer comprises a flat top surface, and the bottom electrode and the spacer contact the flat top surface.

\* \* \* \* \*